(12) United States Patent
Hwang

(10) Patent No.: US 6,284,981 B1
(45) Date of Patent: Sep. 4, 2001

(54) ELEMENT AND METHOD FOR SECURING A CIRCUIT COMPONENT TO A CIRCUIT BOARD

(75) Inventor: Liang Hwang, Old Bridge, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/432,775

(22) Filed: Nov. 2, 1999

(51) Int. Cl.[7] ................................................. H01B 17/00
(52) U.S. Cl. ..................... 174/138 G; 174/52.1; 174/61; 174/138 R; 336/92; 338/317; 248/220.21; 248/500; 361/631; 361/638; 361/649; 361/760; 361/761
(58) Field of Search ................. 174/52.1, 61, 58, 174/135, 137 R, 138 G, 138 H, 138 J, 138 R; 336/92; 350/334; 338/317; 248/500, 220.21; 361/403, 631, 638, 649, 760, 761

(56) References Cited

U.S. PATENT DOCUMENTS

| | | | | |
|---|---|---|---|---|
| 3,920,208 | * | 11/1975 | Dowdy et al. | 248/56 |
| 4,136,269 | * | 1/1979 | Weidler | 200/67 D |
| 4,336,417 | * | 6/1982 | Hickling | 174/52 R |
| 4,588,854 | * | 5/1986 | Bailey et al. | 174/52 R |
| 4,595,794 | * | 6/1986 | Wasserman | 174/138 G |
| 4,600,971 | * | 7/1986 | Rose et al. | 361/421 |
| 5,647,748 | * | 7/1997 | Mills et al. | 439/81 |
| 5,671,118 | * | 9/1997 | Blomquist | 361/704 |
| 5,761,036 | * | 6/1998 | Hopfer et al. | 361/704 |

* cited by examiner

Primary Examiner—Anthony Dinkins
Assistant Examiner—Adolfo Nino
(74) Attorney, Agent, or Firm—David L. Davis

(57) ABSTRACT

A U-shaped metal member for securing a circuit component to a circuit board in place of conventional screws and nuts. The element is inserted through aligned holes of the component and the board and is wave soldered to the board for permanent securement.

8 Claims, 1 Drawing Sheet

ELEMENT AND METHOD FOR SECURING A CIRCUIT COMPONENT TO A CIRCUIT BOARD

BACKGROUND OF THE INVENTION

This invention relates to the field of electronics packaging and, more particularly, to securing a circuit component to a circuit board.

In a particular application, a proximity switch is mounted on a printed circuit board. The proximity switch is provided with a pair of mounting holes. At the present time, the most common way of securing the proximity switch to the circuit board is by using screws and nuts. Thus, at least four piece parts are required. In addition, securing the screws and the nuts requires a manual operation. Accordingly, it would be desirable to have a way of securing a proximity switch to a circuit board which uses a minimum number of piece parts and which is adaptable to automated techniques.

SUMMARY OF THE INVENTION

According to the present invention, there is provided an attachment element for securing a circuit component to a circuit board, wherein the circuit board has a pair of spaced openings extending therethrough and the circuit component has a pair of spaced openings extending therethrough and spaced to be registrable with the circuit board openings. The attachment element comprises a U-shaped metal member having a pair of legs spaced the same as the spacing between the circuit board openings. Each of the legs has a length at least equal to the combined thickness of the component and the board when the component is placed on the board for securement thereto.

In accordance with an aspect of this invention, the distal ends of the pair of legs converge toward each other. Accordingly, the legs of the metal member are insertable through respective aligned pairs of openings of the component and the board and resiliently grip the board.

To secure the circuit component to the circuit board using the aforedescribed attachment element, the circuit component is placed on a first side of the circuit board with the component openings in registration with respective board openings and the legs of the metal member are inserted each through a respective aligned pair of openings of the circuit component and the circuit board, and with the distal ends of the legs extending beyond the second side of the circuit board. To make the attachment permanent, the extending distal ends of the legs are soldered to the circuit board.

In accordance with another aspect of this invention, the step of soldering comprises the step of wave soldering the second side of the circuit board. Accordingly, this final step can be part of the wave soldering step for all of the circuit board components.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
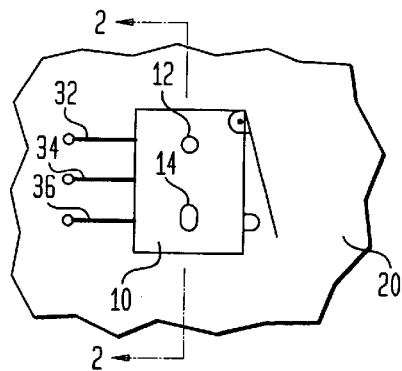
FIG. 1 is a top plan view of a proximity switch placed on a circuit board for securement thereto according to the present invention.
Figure 2:
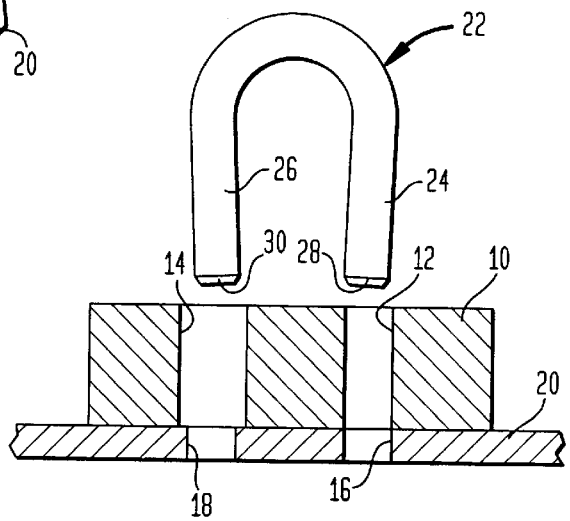
FIG. 2 is a cross sectional view taken along the line 2—2 in FIG. 1 showing the attachment element prior to its insertion through the switch and circuit board openings.

Referring now to the drawings, a proximity switch 10 is formed with mounting holes 12, 14 which are spaced to be registrable with holes 16, 18, respectively, in a circuit board 20. The circuit board holes 16, 18 are plated through-holes.

It is critical that the proximity switch 10 be precisely positioned on the board 20. Accordingly, the holes 16, 18 are precisely placed on the board 20. The holes 16, 18 are round, as is the mounting hole 12, which is of substantially the same size as the hole 16. The mounting hole 14, however, is elongated and its width is substantially the same as the diameter of the hole 18.

In place of the conventional screws and nuts, there is provided an attachment element 22, which is a U-shaped metal member having a pair of legs 24, 26. Preferably, the attachment element 22 is formed of tin plated brass, and has a circular cross section of diameter such that it fits snugly within the holes 16, 18, which are plated through-holes. The leg 24 also fits snugly within the mounting hole 12 and the leg 26 fits snugly within the width of elongated mounting hole 14. Each of the legs 24, 26 has a length at least equal to the combined thickness of the switch 10 and the board 20.

The legs 24, 26 are "toed-in" so that they converge toward their distal ends 28, 30, respectively. The distal ends 28, 30 are preferably beveled for ease of insertion through the holes 12, 14, 16, 18.

Figure 3:
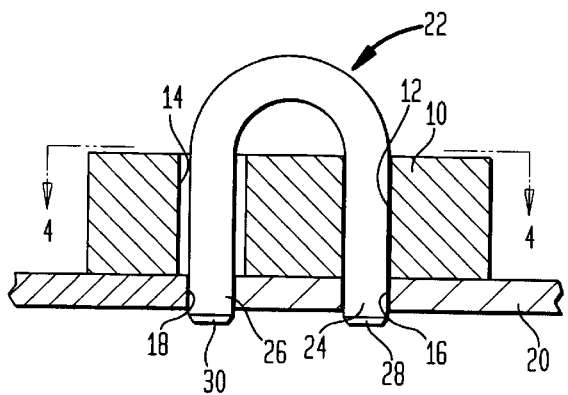
FIG. 3 is a cross sectional view taken along the line 2—2 in FIG. 2 showing the attachment element inserted through the switch and circuit board openings.
Figure 4:
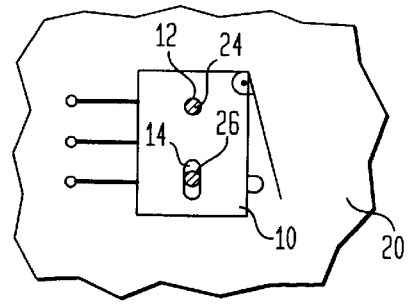
FIG. 4 is a view taken along the line 4—4 in FIG. 3.

In use, the switch 10 is placed on the board 20 with the hole 12 in registration with the hole 16 and with the hole 14 in registration with the hole 18. The element 22 has its legs 24, 26 each inserted through a respective pair of aligned holes 12, 16 and 14, 18, respectively. The length of the legs 24, 26 are such that the distal ends 28, 30 extend beyond the lower side of the board 20, as seen in FIG. 3. The toe-in of the legs 24, 26 enables the element 22 to grab the circuit board 20 and hold the switch 10 thereto. The snug fit of the legs 24, 26 in the mounting holes 12, 14, respectively, holds the switch 10 in proper alignment.

It is conventional practice in the manufacture of a printed circuit board to install all of the electrical components and then transport the board to a wave soldering station. The switch 10 has leads 32, 34, 36 which are also wave soldered. The tight fit of the attachment element 22 holds the switch 10 in place on the board 20 for transport to the wave soldering station. At the wave soldering station, the legs 24, 26 of the attachment element 22 are soldered to the plated through-holes 16, 18 of the circuit board 20, thereby securely and permanently securing the switch 10 to the board 20.

The aforedescribed arrangement minimizes the amount of parts required to secure the switch 10 to the board 20. In addition, the use of the attachment element 22 is readily adapted to automation techniques.

Accordingly, there has been disclosed an improved attachment element and method for securing a circuit component to a circuit board. While an illustrative embodiment of the present invention has been disclosed herein, it is understood that various adaptations and modifications to the disclosed embodiment are possible and it is intended that this invention be limited only by the scope of the appended claims.

What is claimed is:

1. A method for securing a circuit component to a circuit board having first and second sides, wherein the circuit board has a pair of spaced openings extending therethrough from the first side to the second side and the circuit component has a pair of openings extending therethrough and spaced to be registrable with the circuit board openings, the method comprising the steps of:

provided a U-shaped metal member having a pair of legs spaced the same as the spacing between the circuit board openings, wherein each of the pair of legs has a respective distal end;

placing the circuit component on the first side of the circuit board with each of the component openings in registration with a respective one of the board openings;

inserting the legs of the metal member each through a respective one of the aligned pairs of openings of the circuit component and the circuit board, and with the distal ends of the legs extending beyond the second side of the circuit board; and soldering the distal ends of the legs to the circuit board.

2. The method according to claim 1 wherein the openings of the circuit board are plated through-holes and the step of soldering comprises the step of:

wave soldering the second side of the circuit board.

3. The method according to claim 1 wherein the step of providing includes the step of:

causing the distal ends of the pair of legs of the metal member to converge toward each other;

whereby the legs of the metal member resiliently grip the board to maintain the component and the board in relative position after the step of inserting and before the step of soldering.

4. An attachment element for securing a circuit component to a circuit board, wherein the circuit board has a pair of spaced openings extending therethrough and the circuit component has a pair of openings extending therethrough and spaced to be registrable with the circuit board openings, the attachment element comprising:

a U-shaped metal member having a pair of legs spaced the same as the spacing between the circuit board openings, each of the legs having a length at least equal to the combined thickness of the component and the board when the component is placed on the board for securement thereto.

5. The attachment element according to claim 4 wherein each of the pair of legs has a respective distal end and the distal ends of the pair of legs converge toward each other;

whereby the legs of the metal member are insertable through respective one of the aligned pairs of openings of the component and the board and resiliently grip the board.

6. The attachment element according to claim 4 wherein the metal member is tin plated brass.

7. The attachment element according to claim 4 wherein the distal ends of the pair of legs are beveled.

8. The attachment element according to claim 4 wherein the legs have a circular cross section of diameter to fit snugly within the openings of the component and the board.

* * * * *